United States Patent
Koyama et al.

(10) Patent No.: US 9,006,830 B2
(45) Date of Patent: Apr. 14, 2015

(54) SEMICONDUCTOR DEVICE

(71) Applicant: Seiko Instruments Inc., Chiba (JP)

(72) Inventors: Takeshi Koyama, Chiba (JP); Yoshitsugu Hirose, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 14/062,019

(22) Filed: Oct. 24, 2013

(65) Prior Publication Data
US 2014/0117451 A1 May 1, 2014

(30) Foreign Application Priority Data
Oct. 30, 2012 (JP) .................................. 2012-239494

(51) Int. Cl.
| | |
|---|---|
| H01L 23/62 | (2006.01) |
| H01L 29/76 | (2006.01) |
| H01L 29/417 | (2006.01) |
| H01L 23/482 | (2006.01) |

(52) U.S. Cl.
CPC ...... *H01L 29/41758* (2013.01); *H01L 23/4824* (2013.01); *H01L 2924/0002* (2013.01)

(58) Field of Classification Search
CPC ................................................. H01L 29/7831
USPC ................................................ 257/355, 357
See application file for complete search history.

(56) References Cited

U.S. PATENT DOCUMENTS

| | | | | |
|---|---|---|---|---|
| 6,909,149 | B2 * | 6/2005 | Russ et al. | 257/355 |
| 7,009,252 | B2 * | 3/2006 | Lin et al. | 257/355 |

OTHER PUBLICATIONS

Patent Abstracts of Japan, Publication No. 2007-116049, Publication Date May 10, 2007.
Patent Abstracts of Japan, Publication No. 2010-219504, Publication Date Sep. 30, 2010.
Patent Abstracts of Japan, Publication No. 2011-210904, Publication Date Oct. 20, 2011.

* cited by examiner

*Primary Examiner* — Theresa T Doan
(74) *Attorney, Agent, or Firm* — Adams & Wilks

(57) ABSTRACT

Provided is a semiconductor device having high ESD tolerance. A first via (16) is used for electrically connecting a pad (22) to a drain of an NMOS transistor of an ESD protective circuit. The first vias (16) are formed under the pad (22) only on one side of a rectangular ring-shaped intermediate metal film (17) and on another side thereof opposed to the one side. In other words, all the first vias (16) for establishing an electrical connection to the drains are present substantially directly under the pad (22). Consequently, a surge current caused by ESD and applied to the pad (22) is more likely to flow uniformly among all the drains. Then, respective channels of the NMOS transistor of the ESD protective circuit are more likely to uniformly operate, and hence the ESD tolerance of the semiconductor device is increased.

4 Claims, 5 Drawing Sheets

SEMICONDUCTOR DEVICE

BACKGROUND OF THE INVENTION

1. Field of the Invention

The present invention relates to a semiconductor device including an NMOS transistor under a pad.

2. Description of the Related Art

A semiconductor device, also called an IC or a semiconductor chip, has a pad as an external connection electrode in order to establish an electrical connection to another element or another semiconductor device. In the vicinity of the pad, an ESD protective circuit is generally provided for protecting an internal circuit of the semiconductor device from electrostatic discharge (ESD). The ESD protective circuit uses a multi-finger NMOS transistor in many cases. In this case, a gate electrode, a source, and a back gate of the NMOS transistor are connected to a ground terminal, and a drain thereof is connected to the pad.

By the way, various approaches are attempted for the ESD protective circuit using the multi-finger NMOS transistor so that respective channels may uniformly operate to increase ESD tolerance of the semiconductor device. Specifically, for example, the technology of Japanese Published Patent Application No. 2011-210904 appropriately controls a distance between a salicide metal film and a gate electrode of the NMOS transistor of the ESD protective circuit. The technology of Japanese Published Patent Application No. 2010-219504 appropriately controls the number of contacts of the source. The technology of Japanese Published Patent Application No. 2007-116049 appropriately controls the channel length. The technologies are each aimed at finely defining the layout of the NMOS transistor.

A surge current caused by ESD is, however, an extremely large and instantaneous current. Consequently it is significantly difficult to define the layout of the NMOS transistor based on the surge current. In contrast, it is practically almost impossible to quantify the dependency of the ESD tolerance on the layout of the NMOS transistor, either.

SUMMARY OF THE INVENTION

The present invention has been made in view of the above-mentioned problems, and provides a semiconductor device capable of increasing ESD tolerance without defining the dimensions of the layout of a multi-finger NMOS transistor for ESD protection.

In order to solve the above-mentioned problems, one embodiment of the present invention provides a semiconductor device including: an NMOS transistor formed under a pad, the NMOS transistor including: a region for a source and a region for a drain, which are alternately formed; and a gate electrode formed above a channel between the source and the drain, the NMOS transistor having an even number of the channels; a lower metal film for establishing an electrical connection to the drain; an intermediate metal film having a rectangular ring shape and including an opening under the pad; a first via for electrically connecting the lower metal film and the intermediate metal film to each other and for establishing an electrical connection to the drain; an upper metal film for exposing the pad from a pad opening that is substantially aligned with the opening; and a protective film including the pad opening. The first vias are formed only on one side of the intermediate metal film and on another side thereof opposed to the one side.

The first via is used for electrically connecting the pad to the drain of the NMOS transistor of the ESD protective circuit. The first vias are formed under the pad only on one side of the rectangular ring-shaped intermediate metal film and on another side thereof opposed to the one side. In other words, all the first vias for establishing the electrical connection to the drains are present substantially directly under the pad in a symmetric arrangement.

Consequently, a surge current caused by ESD and applied to the pad is more likely to flow uniformly among all the drains. Then, the respective channels of the NMOS transistor of the ESD protective circuit are more likely to uniformly operate, and hence the ESD tolerance of the semiconductor device can be increased.

BRIEF DESCRIPTION OF THE DRAWINGS

In the accompanying drawings:

FIGS. 1A and 1B are plan views illustrating a pad structure of a semiconductor device according to a first embodiment of the present invention, in which FIG. 1A illustrates a diffusion region, a gate electrode, a contact, and a pad opening, and FIG. 1B illustrates the diffusion region, a lower metal film, and the pad opening;

FIGS. 2A and 2B are plan views illustrating the pad structure of the semiconductor device according to the first embodiment of the present invention, in which FIG. 2A illustrates the lower metal film, a first via, an intermediate metal film, and the pad opening, and FIG. 2B illustrates a second via, an upper metal film, and the pad opening;

DETAILED DESCRIPTION OF THE PREFERRED EMBODIMENTS

Now, a first embodiment of the present invention is described with reference to the accompanying drawings.

Figure 1A:
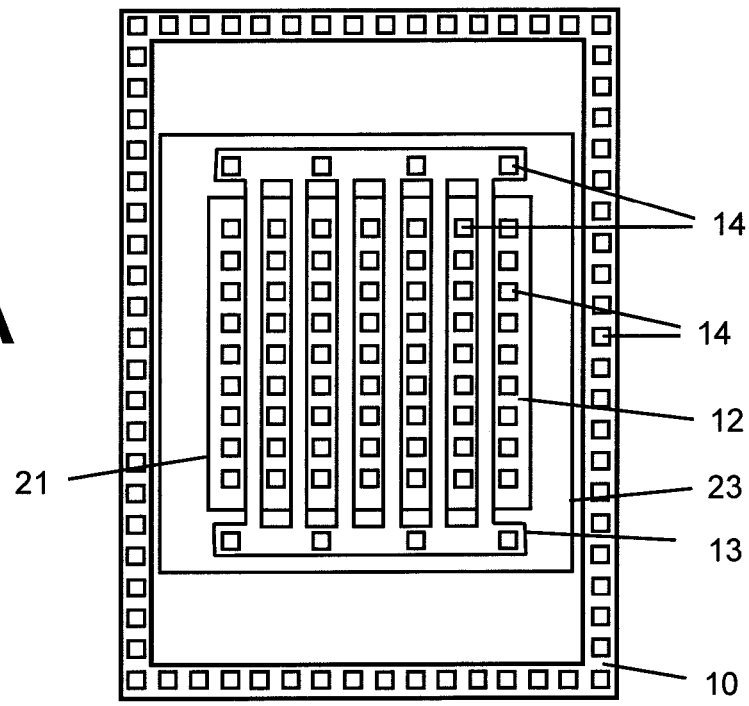
Figure 1B:
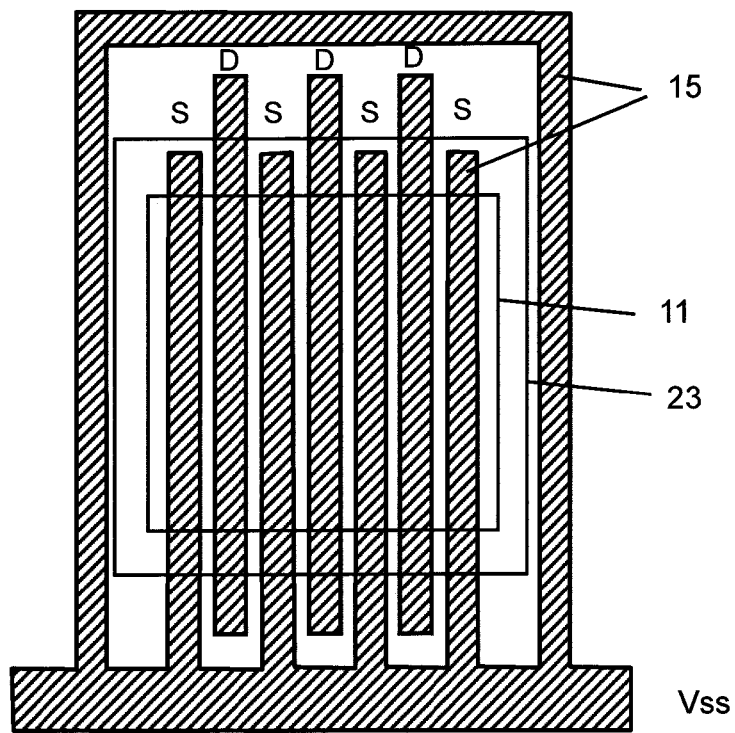
Figure 2A:
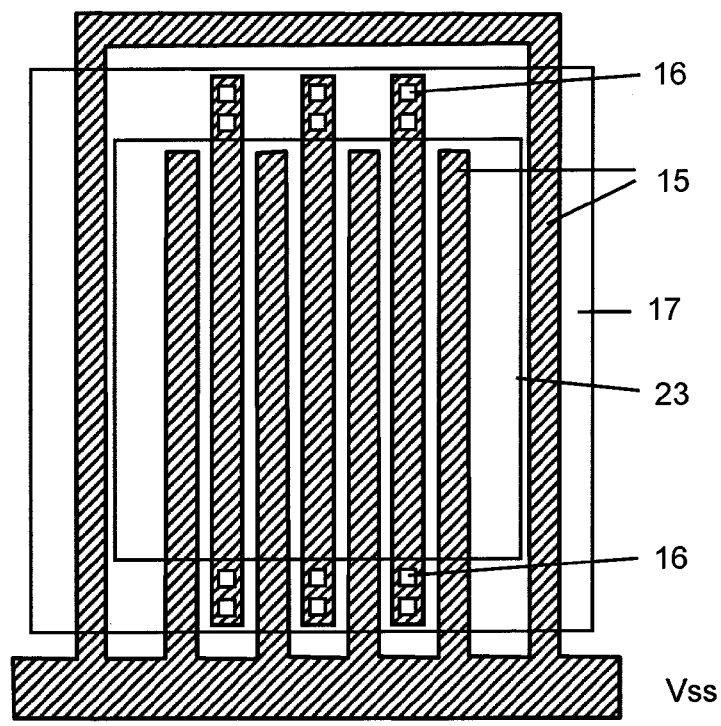
Figure 2B:
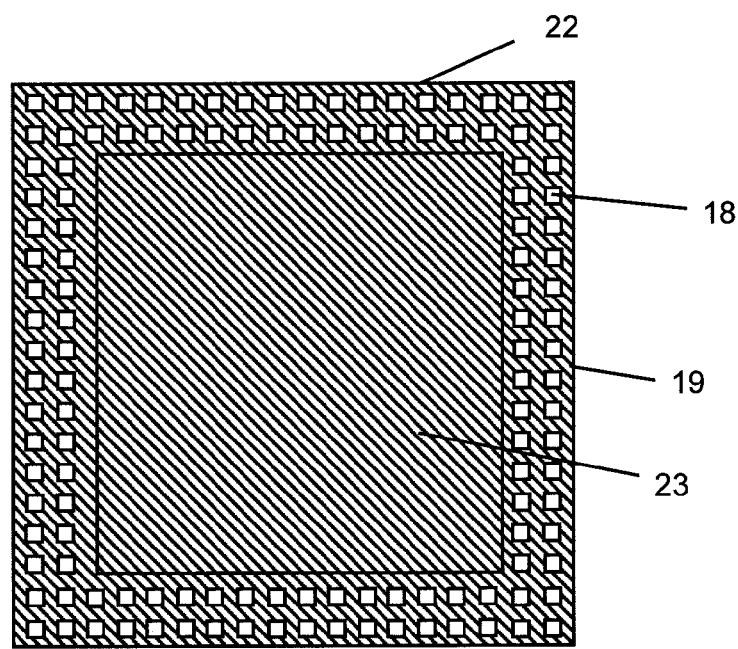

First, a pad structure of a semiconductor device according to the first embodiment of the present invention is described with reference to FIGS. 1A and 1B and FIGS. 2A and 2B. FIGS. 1A and 1B are plan views illustrating the pad structure of the semiconductor device. FIG. 1A illustrates a diffusion region, a gate electrode, a contact, and a pad opening, and FIG. 1B illustrates the diffusion region, a lower metal film, and the pad opening. FIGS. 2A and 2B are plan views illustrating the pad structure of the same semiconductor device as in FIGS. 1A and 1B. FIG. 2A illustrates the lower metal film, a first via, an intermediate metal film, and the pad opening, and FIG. 2B illustrates a second via, an upper metal film, and the pad opening.

As illustrated in FIG. 1A, a P-type diffusion region 10 for fixing a substrate potential and N-type diffusion regions 12 for a source and a drain are formed, and a gate electrode 13 is formed between the N-type diffusion regions 12 for the source and drain, to thereby construct an NMOS transistor 21. The NMOS transistor 21 is a multi-finger transistor. The NMOS transistor 21 is surrounded by the P-type diffusion region 10 for fixing the substrate potential, and includes the N-type diffusion regions 12 for the source and drain that are alternately formed. The gate electrodes 13 are connected to each other at both ends in the gate width direction, which are the vertical ends in the figures. In this case, the number of channels is even, and the N-type diffusion regions 12 to be the source are formed as diffusion regions at both ends in the gate length direction. This realizes a horizontally symmetric structure because the drains of the NMOS transistor 21 are always sandwiched on left and right sides in the figure by the gate electrode 13. Consequently, in each transistor of the NMOS transistor 21, a current caused by an ESD surge flows from the drain to the source in a horizontally symmetric manner in the figure about each drain. The gate electrode 13, the source, and the P-type diffusion region 10 of the NMOS transistor 21 are connected to a ground terminal and applied with a ground voltage VSS. Contacts 14 are formed on the N-type diffusion regions 12 for the source and drain, and the drain and a lower metal film 15 are electrically connected to each other through the contact 14.

FIG. 1B illustrates the arrangement of the lower metal film 15 for establishing the electrical connection to the drain. The drain is finally connected to a pad. The lower metal film 15 connects the gate electrode, the source, and the P-type diffusion region 10 to the ground terminal. In FIG. 1B, symbol "S" represents the source and symbol "D" represents the drain. A region into which impurities for forming the N-type diffusion region 12 are implanted is defined by a resist mask opening 11.

As illustrated in FIG. 2A, an intermediate metal film 17 having a rectangular ring shape and including an opening under a pad 22 to be subsequently formed is formed on the lower metal film 15. In FIG. 2A, the intermediate metal film 17 is illustrated as being transparent so that the underlying lower metal film 15 may be seen. A first via 16 is formed between the lower metal film 15 and the intermediate metal film 17. The first via 16 electrically connects the lower metal film 15 and the intermediate metal film 17 to each other. The intermediate metal film 17 is electrically connected to the drain through the lower metal film 15. The first vias 16 are formed only on one side of the intermediate metal film 17 in the channel width direction and on the other side thereof opposed to the one side. By forming the first vias in this way, the semiconductor device having the pad and including the NMOS transistor may have symmetry in all components about a central straight line of the NMOS transistor in the channel width direction. In this example, the central straight line is a straight line passing through the center of the drain formed at the middle.

Further, a continuous thick insulating film is present because the intermediate metal film 17 has the rectangular ring shape and no intermediate metal film 17 is present under the pad 22. In this manner, when the pad 22 serving as an external connection electrode is wire-bonded, even if a stress occurs in the downward direction of the pad 22 due to an impact of wire-bonding, the stress is absorbed by the thick insulating film and a crack is thus less likely to be generated in the insulating film. Besides, in probing, even if a probe needle of a probe card comes into contact with the pad 22 and an impact occurs due to the contact, a crack is less likely to be generated in the insulating film.

As illustrated in FIG. 2B, a second via 18 is formed on the intermediate metal film 17, and an upper metal film 19 to be a pad is formed thereon. The second via 18 electrically connects the intermediate metal film 17 and the upper metal film 19 to each other. On a surface of the upper metal film 19, a protective film including a pad opening 23 that is substantially aligned with the opening of the intermediate metal film 17 is formed. The pad 22 has the upper metal film 19 exposed from the pad opening 23.

The semiconductor device including the NMOS transistor 21 formed under the pad and serving as an ESD protective circuit described in the embodiment above with reference to FIGS. 1A and 1B and FIGS. 2A and 2B is suitable for ESD protection of a power supply terminal. For use in ESD protection of an input terminal, the following method may be employed. Specifically, the lower metal films 15 formed on the drains are connected to each other, and the lower metal film 15 is led to an internal circuit from a portion provided on a back gate in which the lower metal film 15 is not formed.

Figure 3:
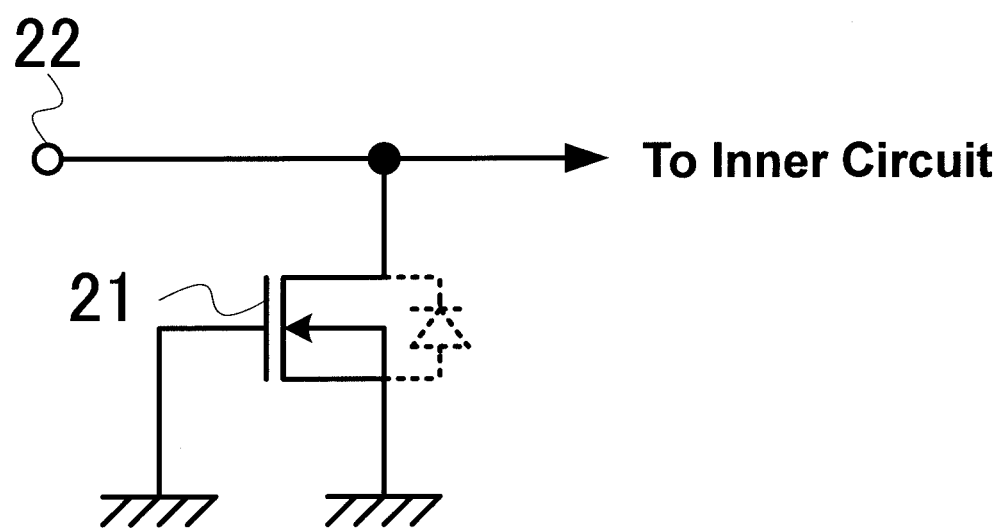
FIG. 3 is a circuit diagram illustrating an ESD protective circuit formed under a pad of the semiconductor device.

Next, a description is given of an ESD protective operation by the ESD protective circuit formed under the pad 22 of the semiconductor device. FIG. 3 is a circuit diagram illustrating the NMOS transistor 21 serving as the ESD protective circuit formed under the pad of the semiconductor device.

When a positive surge is applied to the pad 22, the surge voltage is applied to the drain of the NMOS transistor 21 constructing the protective circuit. A breakdown occurs at the drain because the surge voltage is large, and a current flows into the substrate to increase the potential of the substrate. When the increase in potential exceeds 0.6 V, a bipolar transistor whose collector is the drain, base is the substrate, and emitter is the source operates to allow a large current caused by the surge to flow to a ground terminal. On the other hand, when a negative surge is applied to the pad 22, a forward voltage is applied to a parasitic diode of the NMOS transistor 21, and a current caused by the surge flows between the pad 22 and the ground terminal via the parasitic diode. In this way, the protective circuit guides the surge to the ground terminal to prevent the surge from being transmitted to an internal circuit, to thereby protect the internal circuit.

According to the present invention, the shapes of the respective metal layers including the pad and the drain and the arrangement of the vias are formed symmetric (horizontally or vertically) without defining the dimensions of the layout of the multi-finger NMOS transistor for ESD protection. Consequently, the respective channels of the NMOS transistor are more likely to operate uniformly, and the ESD tolerance of the semiconductor device can be increased.

In addition, the NMOS transistor 21 serving as the ESD protective circuit of the semiconductor device is present under the pad 22 of the semiconductor device. Thus, the distance between the drain of the NMOS transistor 21 and the pad 22 is reduced, and the parasitic resistance is reduced correspondingly. When the parasitic resistance from the pad 22 to the drain of the NMOS transistor 21 becomes smaller, a surge current is more likely to flow from the pad 22 to the NMOS transistor 21, and the surge current is less likely to flow from the pad 22 to an internal circuit. Consequently, the internal circuit is further protected from the surge current.

Besides, when the parasitic resistance becomes smaller as described above, even if the surge current flows through the parasitic resistor, local heating at the parasitic resistor becomes smaller. Thus, the NMOS transistor 21 in the ESD protective circuit becomes less susceptible to the reduction in ESD tolerance by the local heating. Consequently, the internal circuit is further protected from the surge current.

Figure 4A:
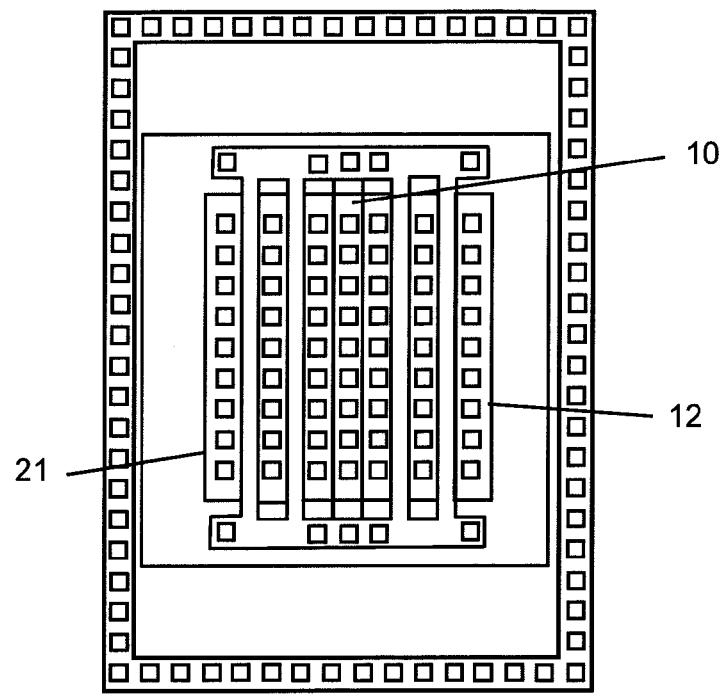
FIGS. 4A and 4B are plan views illustrating a pad structure of a semiconductor device according to a second embodiment of the present invention.
Figure 4B:
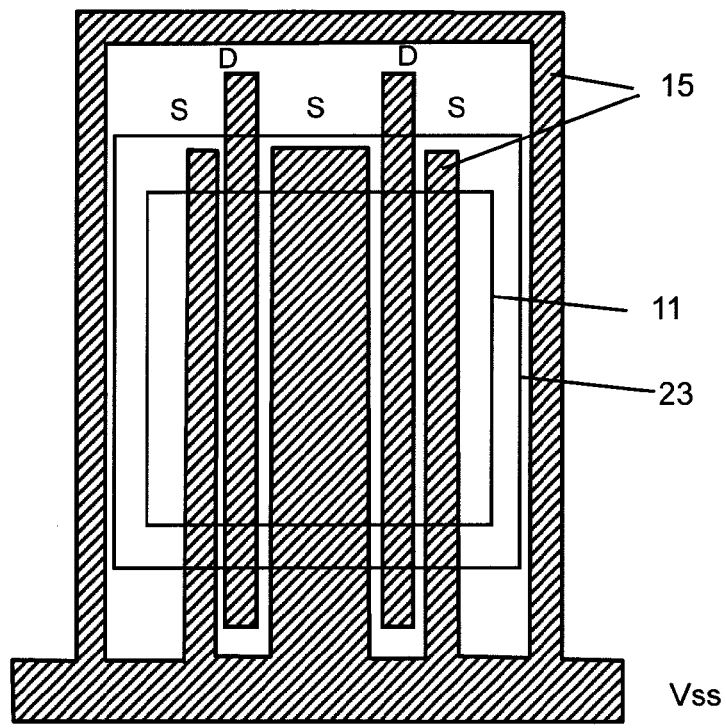

FIGS. 4A and 4B illustrate a second embodiment of the present invention. FIG. 4A illustrates a diffusion region, a gate electrode, a contact, and a pad opening, and FIG. 4B illustrates the diffusion region, a lower metal film, and the pad opening. As illustrated in FIG. 4A, in the case where the NMOS transistor 21 has the source regions at both ends and at the center, in order to stabilize a substrate potential in the vicinity of the source and drain regions, the P-type diffusion region 10 for fixing the substrate potential can be formed along the center of the NMOS transistor 21 so as to be adjacent to the N-type diffusion region 12 for the source.

Figure 5A:
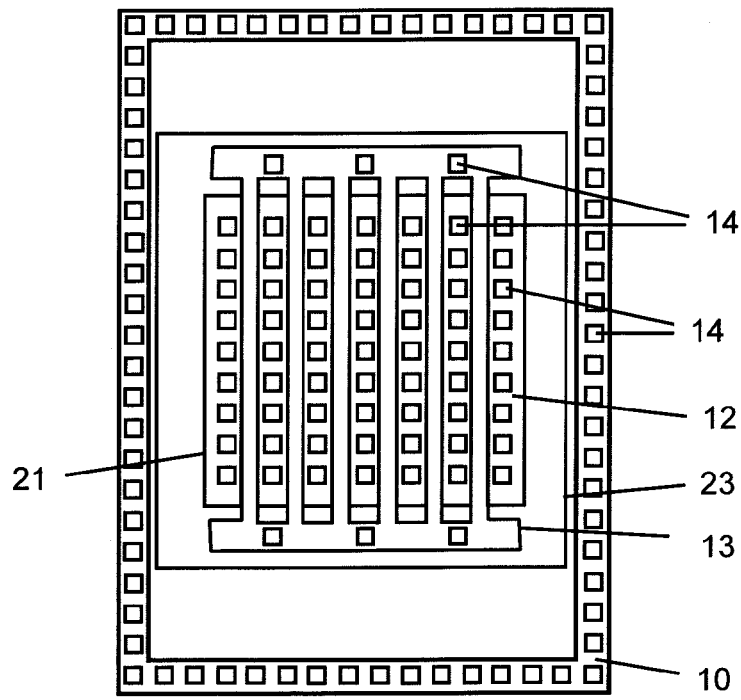
FIGS. 5A and 5B are plan views illustrating a pad structure of a semiconductor device according to a third embodiment of the present invention.
Figure 5B:
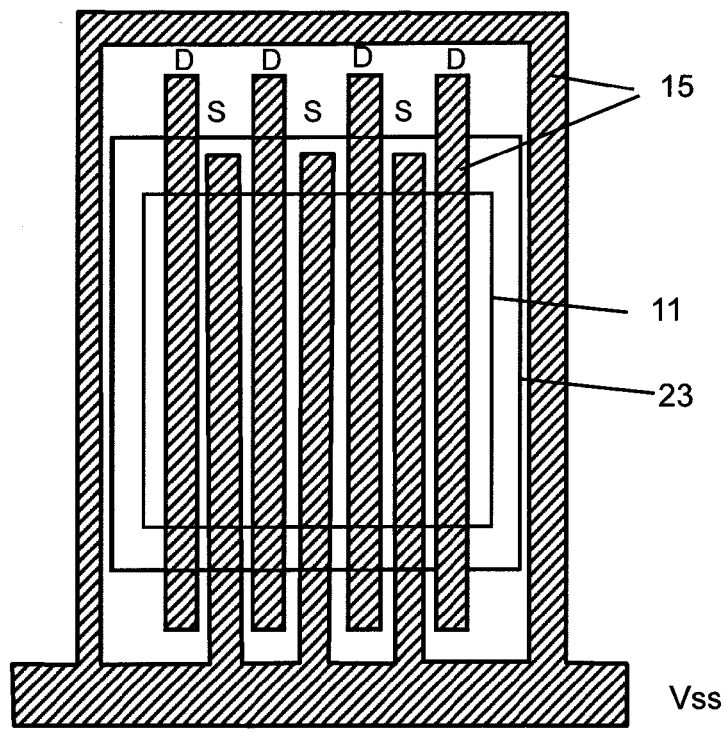

FIGS. 5A and 5B illustrate a third embodiment of the present invention. FIG. 5A illustrates a diffusion region, a gate electrode, a contact, and a pad opening, and FIG. 5B illustrates the diffusion region, a lower metal film, and the pad opening. Although the NMOS transistor 21 of FIGS. 1A and 1B includes the N-type diffusion region 12 serving as the source as a diffusion region at the end in the gate length direction, the NMOS transistor 21 may include an N-type diffusion region 12 serving as the drain as illustrated in FIG. 5A.

The opening of the intermediate metal film 17 and the pad opening 23 only need to be rectangular, and may also be square or oblong.

Although the three-layered metal film including the lower metal film 15, the intermediate metal film 17, and the upper metal film 19 is used in the above description, a metal film of four or more layers may be used as appropriate. In this case, the metal film under the upper metal film needs to have a rectangular ring shape and include an opening under the pad 22.

Although the gate electrode 13 of the NMOS transistor 21 is continuous in the above description, the gate electrode 13 may be cut as appropriate as long as the symmetry is satisfied though not illustrated. The cut gate electrodes 13 are connected by the lower metal film 15.

What is claimed is:

1. A semiconductor device, comprising:
    an NMOS transistor formed under a pad,
        the NMOS transistor comprising:
            a diffusion region for a source and a diffusion region for a drain, each alternately arranged;
            a gate electrode disposed above each channel between the source and the drain; and
            a P-type diffusion region for fixing a substrate potential, the P-type diffusion region surrounding the diffusion region for the source, the diffusion region for the drain, and the gate electrode,
        the NMOS transistor having an even number of the channels;
        a first lower metal film formed on the drain, for establishing an electrical connection to the drain;
        a second lower metal film for electrically connecting the source and the gate electrode to the P-type diffusion region;
        an intermediate metal film electrically connected to the first lower metal film through a first via, the intermediate metal film having a rectangular ring shape and including an opening under the pad;
        an upper metal film that forms the pad, the upper metal film being formed on the intermediate metal film and electrically connected to the intermediate metal film through a second via; and
        a protective film including a pad opening that is aligned with the opening,
        the first vias being formed only on one side of the intermediate metal film and on another side thereof opposed to the one side,
        the diffusion region for the source and the diffusion region for the drain being formed symmetrically about a straight line in a channel width direction of the NMOS transistor.

2. A semiconductor device according to claim 1, wherein the NMOS transistor comprises the diffusion regions for the source as diffusion regions at both ends in a gate length direction.

3. A semiconductor device according to claim 1, wherein the NMOS transistor comprises the diffusion regions for the drain as diffusion regions at both ends in a gate length direction.

4. A semiconductor device according to claim 2, wherein the NMOS transistor further comprises a P-type diffusion region for fixing the substrate potential, the P-type diffusion region being located at a center of the NMOS transistor and sandwiched on both sides by the diffusion regions for the source.

* * * * *